(12) United States Patent
Moore

(10) Patent No.: US 7,038,602 B1
(45) Date of Patent: May 2, 2006

(54) METHOD FOR CORRECTING PERIODIC SAMPLING ERRORS

(75) Inventor: George S. Moore, Veradale, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/977,905

(22) Filed: Oct. 30, 2004

(51) Int. Cl.
*H03M 1/06* (2006.01)

(52) U.S. Cl. .................. 341/118; 341/120; 341/141

(58) Field of Classification Search ............. 341/155, 341/120, 118, 117, 119, 141; 702/89
See application file for complete search history.

(56) References Cited

U.S. PATENT DOCUMENTS

| | | | | |
|---|---|---|---|---|
| 4,763,105 A | * | 8/1988 | Jenq | 341/120 |
| 4,968,988 A | * | 11/1990 | Miki et al. | 341/141 |
| 5,105,192 A | * | 4/1992 | Takahashi | 341/110 |
| 5,294,926 A | * | 3/1994 | Corcoran | 341/120 |
| 5,799,130 A | * | 8/1998 | Hoshi | 386/124 |
| 6,016,112 A | * | 1/2000 | Knudsen | 341/118 |
| 6,038,518 A | * | 3/2000 | Farwell | 702/89 |
| 6,081,215 A | * | 6/2000 | Kost et al. | 341/120 |
| 6,384,756 B1 | * | 5/2002 | Tajiri et al. | 341/120 |
| 6,522,282 B1 | * | 2/2003 | Elbornsson | 341/155 |
| 6,700,515 B1 | * | 3/2004 | Asami | 341/120 |
| 2005/0271135 A1 | * | 12/2005 | Shida | |

* cited by examiner

*Primary Examiner*—Jean Bruner Jeanglaude

(57) ABSTRACT

In one representative embodiment, scaling factors and delay values associated with respective analog-to-digital converters (ADCs) of an interleaved ADC are stored in memory. As a digital sample from the interleaved ADC is received, a respective amplitude scaling factor is retrieved from memory and applied to the digital sample. Preferably, a first order correction is then applied to the amplitude corrected-sample. The first order correction estimates the derivative using the current amplitude corrected sample and at least one additional amplitude corrected sample. The derivative is multiplied by an estimate of the respective timing delay associated with the particular sample. The corrected amplitude value is added to the multiple of the derivative and the timing delay to form the fully corrected digital sample.

20 Claims, 2 Drawing Sheets

METHOD FOR CORRECTING PERIODIC SAMPLING ERRORS

TECHNICAL FIELD

The present application is generally directed to interleaved analog-to-digital converters (ADCs) and concatenated digital-to-analog converters (DACs).

BACKGROUND

In many applications, it is desirable to sample signals at a rate that is higher than possible using a single analog-to-digital converter (ADC). In such applications, multiple ("N") ADCs may be employed and operated at $1/N^{th}$ of the desired sampling rate. Also, a timing offset is applied between the sampling of each ADC which ideally is the desired sampling period $T_S$. The operation of multiple ADCs in this manner approximates the operation of a single ADC operating at the higher sampling rate. This method is commonly referred to as interleaved sampling. A similar technique can be applied to digital-to-analog converters (DACs) where multiple slower DACs are concatenated to effect a single higher speed DAC.

In practice, errors exist in the timing offsets between sampling by the discrete ADCs. Specifically, the time between sampling from adjacent ADCs differs slightly from the desired sampling period $T_S$. Also, the gain of the multiple ADCs typically varies slightly. The timing errors and the gain errors degrade the reconstructed output signal. Because the timing errors and gain errors are associated with specific discrete ADCs, the timing and gain errors are periodic with a period of N samples. Similar time and gain errors are typically experienced by concatenated DACs.

Known interleaved sampling devices employ analog trims. The analog trims are used to apply a delay and/or loss of a predetermined amount to the signal before sampling by a respective ADC to compensate for timing and/or gain errors.

SUMMARY

Some representative embodiments are directed to systems and methods for correcting timing errors and gain errors of an interleaved ADC in the digital domain. The application of the correction in the digital domain enables analog trims to be omitted or, alternatively, enables the precision of analog trims to be lessened.

In one representative embodiment, relative level factors are determined for each discrete ADC of an interleaved ADC. The scaling factors are calculated to equalize the gain across the respective ADCs. Also, the delay associated with each discrete ADC of the interleaved ADC is determined. The scaling factors and delay values are stored in memory. As a digital sample from the interleaved ADC is received, a respective amplitude scaling factor is retrieved from memory and applied to the digital sample. Preferably, a first order correction is then applied to the amplitude corrected-sample. The first order correction estimates the derivative using the current amplitude corrected sample and at least one additional amplitude corrected sample. The derivative is multiplied by an estimate of the respective timing delay associated with the particular sample. The corrected amplitude value is added to the multiple of the derivative and the timing delay to form the fully corrected digital sample.

In another representative embodiment, error correction is applied to a concatenated DAC in the digital domain before digital data is provided to the DAC. Specifically, during preprocessing of the digital data, the digital data is scaled using relative level factors. Additionally, timing errors are multiplied by a derivative estimate and the multiplied values are applied to correct the timing errors of the concatenated DAC.

DETAILED DESCRIPTION

Figure 1:
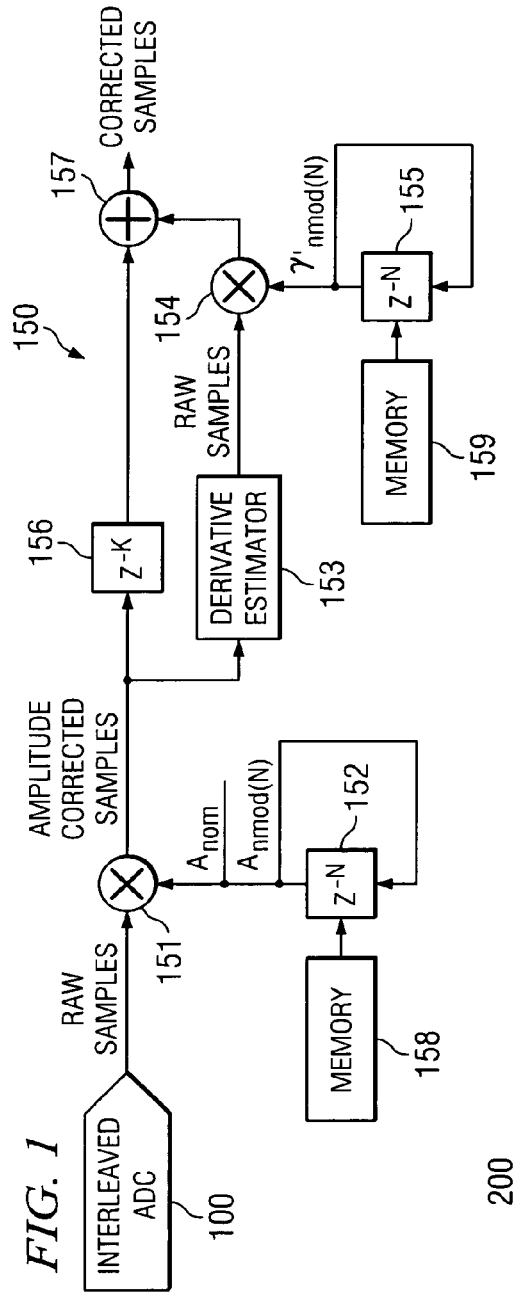
FIG. 1 depicts an interleaved ADC and error correction logic according to one representative embodiment.

Some representative embodiments are directed to systems and methods for correcting amplitude errors and timing errors associated with interleaved ADCs. A number of techniques may be applied to determine the amplitude and timing errors associated with an interleaved ADC. For example, application of a DC signal to an interleaved ADC may be used to determine the amplitude errors. A periodic signal (e.g., a single frequency sinusoidal signal) may be applied to the interleaved ADC. Samples of the periodic signal may be scaled using the previously determined amplitude errors. Then, a respective discrete ADC may be arbitrarily selected to serve as the timing reference (e.g., the selected ADC is defined to possess zero timing error). The samples obtained from the other discrete ADCs may then be compared to numerically calculated values that are expected given the sample value of the reference ADC and the characteristics of the stimulus waveform. The comparison enables the timing errors to be calculated. Hereinafter, further discussion shall assume that the amplitude and timing errors associated with each discrete ADC of the interleaved device are known.

A sampled signal with periodic sampling errors may be modeled as follows:

$$z_n = A_{n \bmod(N)} x(nT_S + y_{n \bmod(N)}),$$

where $z_n$ represents the value of the $n^{th}$ sample subject to amplitude and timing errors by an interleaved ADC having N discrete ADCs, $x(\ )$ is a continuous time domain function representing the signal being sampled, $T_s$ is the sampling rate of the interleaved ADC, $A_{n \bmod(N)}$ represents the gain applied by the interleaved ADC to the $n^{th}$ sample, and $y_{n \bmod(N)}$ represents the timing error applied to the $n^{th}$ sample by the interleaved ADC.

There are N amplitude terms ($A_i$) that represent the gain (including the amplitude error) provided by the respective discrete ADCs of the interleaved ADC. Also, there are N timing error terms ($y_i$) that represent the respective timing deviations from the ideal sampling times (integer multiples of $T_S$). The N amplitude and timing terms are applied periodically to the samples by the n mod(N) operation.

Let $A_{nom}$ be the nominal gain. The error signal is then given by:

$$e_n = A_{nom} x(nT_s) - z_n,$$

-continued $$= A_{nom}x(nT_s) - A_{n \bmod(N)}x(nT_s + y_{n \bmod(N)}),$$

$$= A_{nom}(x(nT_s) - (A_{n \bmod(N)}/A_{nom})(x(nT_s + y_{n \bmod(N)}))).$$

The mis-timed sample may be approximated by a first-order Taylor series expansion as follows:

$$x(nT_S + y_{n \bmod(N)}) \approx x(nT_S) + y_{n \bmod(N)}x'(nT_S),$$

where x'( ) represents the derivative of x( ). Substituting the approximation into the error equation yields:

$$e_n \approx A_{nom}\{(x(nT_s) - (A_{n \bmod(N)}/A_{nom})(x(nT_s) + y_{n \bmod(N)}x'(nT_s))\}$$

$$= A_{nom}x(nT_s)(1 - (A_{n \bmod(N)}/A_{nom})) - A_{nom}y_{n \bmod(N)}x'(nT_s).$$

The term $1 - (A_{n \bmod(N)}/A_{nom})$ represents the normalized error due to the amplitude variation. The amplitude errors between the discrete ADCs of the interleaved ADC can be corrected by multiplying the output samples by the N circulating corrective gain factors $(A_{n \bmod(N)}/A_{nom})$. From this point, it shall be assumed that the sample values are scaled to address the amplitude errors associated with the discrete ADCs of the interleaved device.

If amplitude correction is applied, the error equation simplifies to:

$$e_n \approx -(A_{n \bmod(N)})(x'(nT_S)).$$

By estimating this factor and subtracting the estimate from the amplitude corrected samples, the effects of the sampling time errors can be substantially mitigated.

A number of techniques may be used to estimate the derivate of a waveform using multiple samples of the waveform. Some techniques require more samples and involve greater complexity. Other techniques only use the difference between the current and the immediately preceding sample. One such technique is given by:

$$x'_{est}(nT_s) = (z_n - z_{n-1})/(nT_s + y_{n \bmod(N)} - (n-1)T_s - y_{(n-1) \bmod(N)}),$$

$$= (z_n - z_{n-1})/(T_s + y_{n \bmod(N)} - y_{(n-1) \bmod(N)}).$$

Under the assumption that the timing errors are relatively small as compared to the sampling period ($T_S$), a further simplification can be made as follows:

$$x'_{est}(nT_S) = (z_n - z_{n-1})/(T_S).$$

In practice, this calculation may be included in the required multiplication of the derivative estimate by the sample time error value. One consequence of this technique is that the calculation is a better estimate of the derivative at the midpoint between the two samples as opposed to the location of the sample of interest.

Another estimator that avoids this consequence is given by:

$$x'_{est}(nT_S) = (z_n - z_{n-1})/(2T_S + y_{(n+1) \bmod(N)S} - y_{(n-1) \bmod(N)}).$$

The spectral accuracy of this estimator degrades more quickly with signal BW than the prior estimator and an additional sample of latency is imposed. Generally, such latency is of relatively small importance. Other techniques may employ interpolative filters to estimate the signal at two closely spaced points (as well as apply any a priori knowledge of the signal BW to filter extraneous noise) to improve the accuracy of the derivative estimate.

If the sampling errors are expressed in fractions of a sample period, the computation of the error estimate will reduce to a simple multiplication. Specifically, the $T_S$ denominator factor will intrinsically cancel.

Referring now to the drawings, FIG. 1 depicts interleaved ADC 100 and error correcting logic 150 according to one representative embodiment. Interleaved ADC 100 includes N discrete ADCs (not shown). The raw samples from interleaved ADC 100 are post-processed by error correcting logic 150 to compensate for gain errors and timing errors associated with the N discrete ADCs.

As the digital samples are received by correcting logic 150 the samples are scaled by multiplier 151. Specifically, retrieval logic 152 stores the amplitude correction factors ($A_i$). As each clock tick is applied to correcting logic 150, retrieval logic 152 retrieves a successive correction factor from memory 158 in a circular manner. The retrieved correction factor is provided to multiplier 151 to scale the raw samples.

The amplitude corrected samples are provided to derivative estimator 153 that estimates the derivative of the sampled waveform. As each clock tick is applied, retrieval logic 155 retrieves a successive timing error value from memory 159 in a circular manner. The derivative estimate is scaled by the timing error value. Delay element 156 delays the amplitude corrected samples by the amount of latency associated with derivative estimator 153. The multiple of the derivative estimate and the timing error value is added to the delayed amplitude sample by adder 157.

Some embodiments may vary from the description of error correcting logic 150. For example, delay 156 may be replaced by a filter with delay K samples that might be otherwise desirable for subsequent processing for purposes other than error correction. Additionally, the delay K can be a non-integer value thereby enabling the use of derivative estimators that possess non-integer delay. Also, as previously mentioned, the correction of timing errors in correcting logic 150 occurs using a first order Taylor series approximation. Higher orders could be applied. However, it is believed that the complexity of such higher order embodiments outweigh any potential higher degree of accuracy associated with such orders.

One common application of ADCs is "intermediate frequency (IF) sampling." In IF sampling applications, the signal of interest is a bandpass process centered at an IF frequency. The maximum signal bandwidth is achieved for IF center frequencies given by the equation:

$$F_{IF} = F_S(2M-1)/4,$$

where M is an integer and $F_S$ is the sampling frequency. When M equals one, the maximum signal bandwidth is defined by the classic Nyquist theorem. When M is greater than one, the maximum signal bandwidth relies upon the "super Nyquist" sampling theorem.

IF signals can be represented as the real part of a product of a translating exponential and a complex baseband signal. Specifically, any bandpass signal provided to the ADC as an input signal can be modeled as:

$$x(t) = Re[z(t)e^{j(\omega t + \phi)}],$$

where $\omega$ is the IF frequency, $\phi$ is the phase of the translating signal, and z(t) is the complex baseband signal. The translating frequency need not be precisely centered subject to some limitations to prevent aliasing. However, if the frequency is chosen to be at the "center" of the bandpass modulation, the bandwidth of the resulting baseband signal z(t) will be minimized. This is a generally desirable characteristic for the estimation of the derivative of the baseband signal.

The derivative of the representation of the bandpass signal is given by:

$$x'(t)=Re\{[z'(t)+j\omega z(t)]e^{j(\omega t+\phi)}\}.$$

The derivative can then be expressed in terms of the baseband signal, its derivative, and a complex exponential. A significant component of the derivative is driven by the magnitude of the center frequency as evidenced by the "jω(t)" term. Accordingly, in one representative embodiment, the correction of amplitude errors and timing errors in samples from an interleaved ADC accounts for the component of the derivative that results from the center frequency of the bandpass signal.

Figure 2:
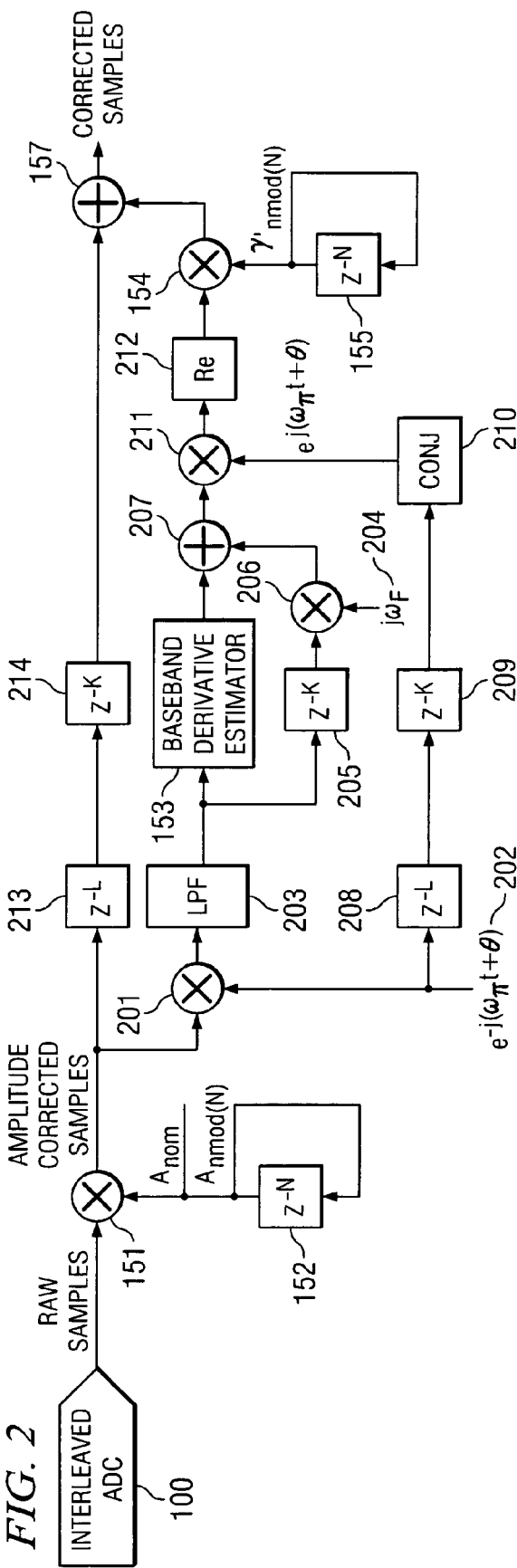
FIG. 2 depicts another interleaved ADC and error correction logic according to one representative embodiment.

FIG. 2 depicts interleaved ADC 100 and correcting logic 200 that is adapted to process IF signals. Specifically, the configuration of correcting logic 200 generates more accurate correction of the interleaved samples of IF signals, because derivative estimator 153 operates at baseband.

Correcting logic 200 is substantially similar to correcting logic 150 of FIG. 1. Specifically, amplitude correction is performed by retrieval logic 152 and multiplier 151. Likewise, retrieval logic 155, multiplier 154, and adder 157 add a correction to the amplitude corrected samples to compensate for the timing errors associated with interleaved ADC 100.

Correcting logic 200 differs from correcting logic 150 by translating the amplitude corrected samples to baseband before estimating the derivatives. Specifically, a respective amplitude corrected sample is multiplied by the appropriate exponential 202 by multiplier 201. Lowpass filter (LPF) 203 is used to remove the conjugate frequency image associated with translating a real signal. Derivative estimator 153 calculates the derivative of the baseband signal. Multiplier 206 multiplies the amplitude corrected signal by the appropriate factor (jω) 204 to form the portion of the derivative associated with the translation exponential.

The outputs of multiplier 206 and derivative estimator 153 are summed by adder 207. The output of adder 207 represents the two components (z'(t)+jω(t)) of the derivative representation of the bandpass signal. Conjugate logic 210 generates the conjugate of exponential 202 and is provided to multiplier 211 to perform a translation back to the IF frequency. The real portion of the output of multiplier 211 is obtained by logic 212 and provided to multiplier 154 for calculation of the timing error correction.

Delay elements 205, 208, 209, 213, and 214 are used to maintain the proper timing between the various logic elements. The "L" sample delay matches the low pass filter delay. The "K" sample delay corrects for the derivative estimation.

In another embodiment, a further simplification can be made. Specifically, if the sampled signal bandwidth is small and the IF frequency is high, the derivative is dominated by the jωz(t) term. If this is the case, the derivative might be approximated by:

$$x'(t) \approx Re\{j\omega z(t)e^{j(\omega t+\phi)}\}$$

thereby eliminating the estimate of the derivative of z(t) altogether. Analysis of an application is warranted to determined if the degradation associated with the simplification is acceptable for the respective application.

Other simplifications are possible. For example, if the signal spectrum is approximately centered at one of the cardinal IF frequenceies ($F_S(2M-1)/4$) and the phase is selected as zero, the complex translation of frequencies reduces to a multiplication of factors that only include ±1 and 0. For example, if M equals 1, the complex down conversion causes the input signal to be successively multiplied by 1, 0, −1, and 0 in a repeated manner. Other values of M yield similar four sample sequences. Even if the signal is not centered at one of the cardinal frequencies, an appropriate choice of the translation frequency can result in simplifications. For example, if the signal center is near $3F_S/8$, the use of $3F_S/8$ for the translation frequency results in the use of the factors 0, ±1, and ±(SQRT(2))/2.

Figure 3:
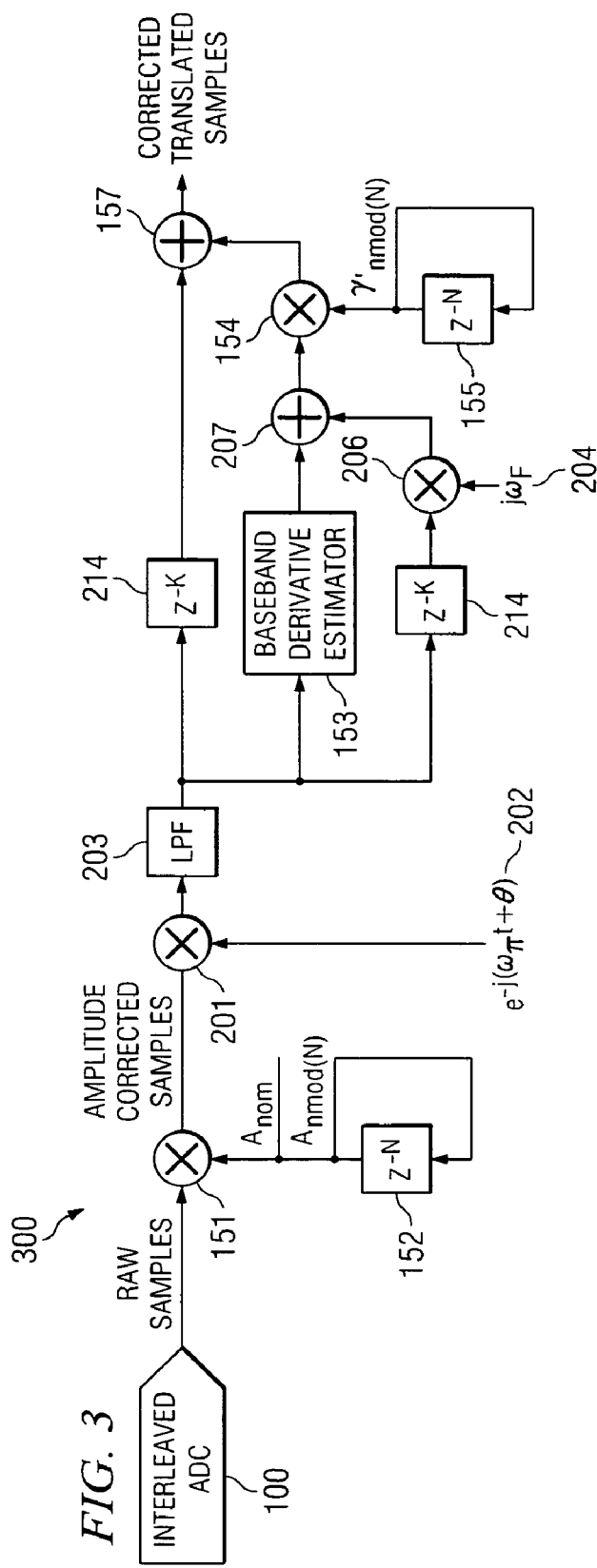
FIG. 3 depicts another interleaved ADC and error correction logic according to one representative embodiment.

Many applications involve a translation of samples to baseband for subsequent processing. Accordingly, in another representative embodiment, correcting logic 300 omits translation back to the IF frequency as shown in FIG. 3. In such embodiments, the numerically controlled oscillator (NCO) and LPF that would be otherwise used for other processing is replaced by the NCO (not shown) use to generate jω signal 204 and LPF 203.

Figure 4:
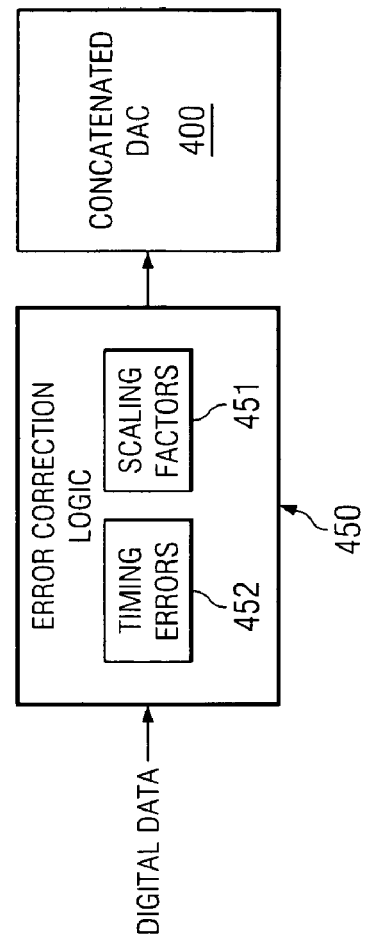
FIG. 4 depicts a concatenated DAC and error correction logic according to one representative embodiment.

FIG. 4 depicts concatenated DAC 400 and error correction logic 450 according to one representative embodiment. Error correction logic 450 operates in substantially the same manner as error correction for an interleaved ADC. A first order correction is preferably applied using timing errors 452. Additionally, scaling factors 451 are preferably applied in a circular manner to achieve a uniform gain across the discrete DACs of concatenated DAC 400.

What is claimed is:

1. A system comprising:
    a first memory for storing values that represent errors associated with respective sampling timing offsets of an interleaved analog-to-digital converter (ADC);
    a derivative estimator logic for generating a value that is indicative of a derivative of an input signal using digital samples from said interleaved ADC;
    a first logic for successively retrieving values from said first memory in a circular manner;
    a first multiplier for multiplying derivative estimate values by respective values from said first logic for successively retrieving; and
    an adder for providing timing error compensation to digital samples using values from said first multiplier.

2. The system of claim 1 further comprising:
    a second memory for storing values that are indicative of amplitude errors associated with respective discrete ADCs of said interleaved ADC;
    a second logic for successively retrieving values from said second memory in a circular manner; and
    a second multiplier for multiplying digital samples by respective values from said second logic for successively retrieving to equalize gain across ADCs of said interleaved ADC, wherein said second multiplier operates before said first multiplier.

3. The system of claim 1 further comprising:
    a down-converting logic for down-converting digital samples, wherein said down-converting operates before said derivative estimator logic.

4. The system of claim 3 further comprising:
    a second multiplier for multiplying down-converted digital samples by a value related to a down-conversion frequency; and
    a second adder for adding output values of said derivative estimator logic with output values of said second multiplier before operation of said adder.

5. The system of claim 3 further comprising:
up-converting logic for up-converting output values from said derivative estimator logic before operation of said first multiplier.

6. The system of claim 1 wherein values stored in said first memory represent timing errors as a fraction of a sampling period of said interleaved ADC.

7. The system of claim 1 wherein said derivative estimator logic calculates a difference between a current digital sample and an immediately preceding digital sample.

8. The system of claim 1 wherein said derivative estimator logic multiplies a current digital sample by a value that is indicative of an intermediate frequency (IF) of said input signal.

9. A method comprising:
receiving digital samples of a signal from an interleaved analog-to-digital (ADC) converter,
calculating estimates of a derivate of said signal using said digital samples;
retrieving values that are related to timing errors of respective discrete ADCs of said interleaved ADC;
multiplying said estimates by said retrieved values to generate timing correction values; and
modifying said digital samples using said timing correction values.

10. The method of claim 9 further comprising:
providing said modified digital samples to said interleaved ADC.

11. The method of claim 9 further comprising:
retrieving scaling values that are related to amplitude errors of respective discrete ADCs of said interleaved ADC; and
multiplying said digital samples by said scaling values.

12. The method of claim 9 further comprising:
down-converting digital samples before performing said calculating.

13. The method of claim 12 wherein said calculating comprises:
multiplying down-converted digital samples by a value related to a down-conversion frequency.

14. The method of claim 12 further comprising:
up-converting said estimates before performing said multiplying.

15. The method of claim 9 wherein said values represent timing errors as a fraction of a sampling period of said interleaved ADC.

16. The method of claim 9 wherein said method is performed in circuitry in real time as digital samples are generated by said interleaved ADC converter.

17. A system comprising:
a first memory for storing values that represent errors associated with timing offsets of a concatenated digital-to-analog converter (DAC);
a derivative estimator logic for generating derivative values;
a first logic for successively retrieving values from said first memory in a circular manner;
a first multiplier for multiplying derivative estimate values by respective values from said first logic for successively retrieving; and
an adder for applying timing error compensation to digital values provided to said concatenated DAC using output values from said first multiplier.

18. The system of claim 17 further comprising:
a second memory for storing values that represent amplitude errors associated with said concatenated DAC;
a second logic for successively retrieving values from said second memory in a circular manner; and
a second multiplier for multiplying digital values for provision to said concatenated DAC by said respective values retrieved by said second logic.

19. The system of claim 17 wherein values stored in said first memory represent timing errors as a fraction of a period of said concatenated DAC.

20. The system of claim 17 wherein said derivative estimator logic generates a derivative value using a current digital value and at least one other digital value.

* * * * *